United States Patent
Beck

(10) Patent No.: US 10,746,834 B2
(45) Date of Patent: Aug. 18, 2020

(54) METHOD AND SYSTEM FOR DETERMINING MAGNETIC RESONANCE IMAGE DATA AS A FUNCTION OF PHYSIOLOGICAL SIGNALS

(71) Applicant: Thomas Beck, Erlangen (DE)

(72) Inventor: Thomas Beck, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 327 days.

(21) Appl. No.: 15/809,382

(22) Filed: Nov. 10, 2017

(65) Prior Publication Data
US 2018/0149725 A1 May 31, 2018

(30) Foreign Application Priority Data
Nov. 25, 2016 (DE) .................. 10 2016 223 478

(51) Int. Cl.
*G01R 33/567* (2006.01)
*G01R 33/28* (2006.01)
*G01R 33/565* (2006.01)

(52) U.S. Cl.
CPC ....... *G01R 33/5676* (2013.01); *G01R 33/288* (2013.01); *G01R 33/5673* (2013.01); *G01R 33/56509* (2013.01)

(58) Field of Classification Search
CPC ........ G01R 33/00; G01R 33/20; G01R 33/28; G01R 33/288; G01R 33/44; G01R 33/48; G01R 33/54; G01R 33/56; G01R 33/565; G01R 33/56509; G01R 33/567; G01R 33/5673; G01R 33/5676; H04N 5/00; H04N 5/222; H04N 5/225; H04N 5/232; H04N 5/23203; H04N 5/23206; H04N 5/23222; G06T 11/00; G06T 11/003; G06T 11/005; A61B 5/00; A61B 5/05; A61B 5/055
USPC ....................... 324/300, 307, 309
See application file for complete search history.

(56) References Cited

U.S. PATENT DOCUMENTS

2011/0152669 A1\* 6/2011 Kassai .............. A61B 5/055
600/413
2012/0245453 A1 9/2012 Tryggestad et al.
(Continued)

FOREIGN PATENT DOCUMENTS

DE 102014210471 A1 12/2015
DE 102015205937 A1 10/2016

OTHER PUBLICATIONS

Beall, Erik B., and Mark J. Lowe. "The non-separability of physiologic noise in functional connectivity MRI with spatial ICA at 3T." Journal of neuroscience methods 191.2 (2010): 263-276.
(Continued)

*Primary Examiner* — Hoai-An D. Nguyen
(74) *Attorney, Agent, or Firm* — Lempia Summerfield Katz LLC

(57) ABSTRACT

MR image data corresponds to physiological signals. First image data is acquired by the magnetic resonance tomograph. Physiological signal data is acquired, and the first image data is provided with first meta data and the physiological signal data with second meta data. The meta data enables a temporal association to the instant of acquisition and the first image data. The physiological signal data is transmitted to an evaluation computer.

16 Claims, 2 Drawing Sheets

(56) References Cited

U.S. PATENT DOCUMENTS

| | | | |
|---|---|---|---|
| 2015/0094561 A1* | 4/2015 | Rey | G01R 33/28 |
| | | | 600/411 |
| 2015/0309143 A1* | 10/2015 | Kuhara | G01R 33/50 |
| | | | 324/309 |
| 2015/0346307 A1 | 12/2015 | Beck | |
| 2016/0292854 A1 | 10/2016 | Beck | |
| 2016/0361041 A1* | 12/2016 | Barsimantov | A61B 8/065 |
| 2018/0292495 A1* | 10/2018 | Sun | G01R 33/5605 |

OTHER PUBLICATIONS

Birn, Rasmus M., et al. "Separating respiratory-variation-related fluctuations from neuronal-activity-related fluctuations in fMRI." Neuroimage 31.4 (2006): 1536-1548.

Birn, Rasmus M., et al. "The effect of scan length on the reliability of resting-state fMRI connectivity estimates." Neuroimage 83 (2013): 550-558.

German Office Action for German Application No. 102016223478.1, dated Jul. 31, 2017.

Glover, Gary H., Tie-Qiang Li, and David Ress. "Image-based method for retrospective correction of physiological motion effects in fMRI: RETROICOR." Magnetic resonance in medicine 44.1 (2000): 162-167.

Hutton, Chloe, et al. "The impact of physiological noise correction on fMRI at 7T." Neuroimage 57.1 (2011): 101-112.

Thomason, Moriah E., et al. "Breath holding reveals differences in fMRI BOLD signal in children and adults." Neuroimage 25.3 (2005): 824-837.

* cited by examiner

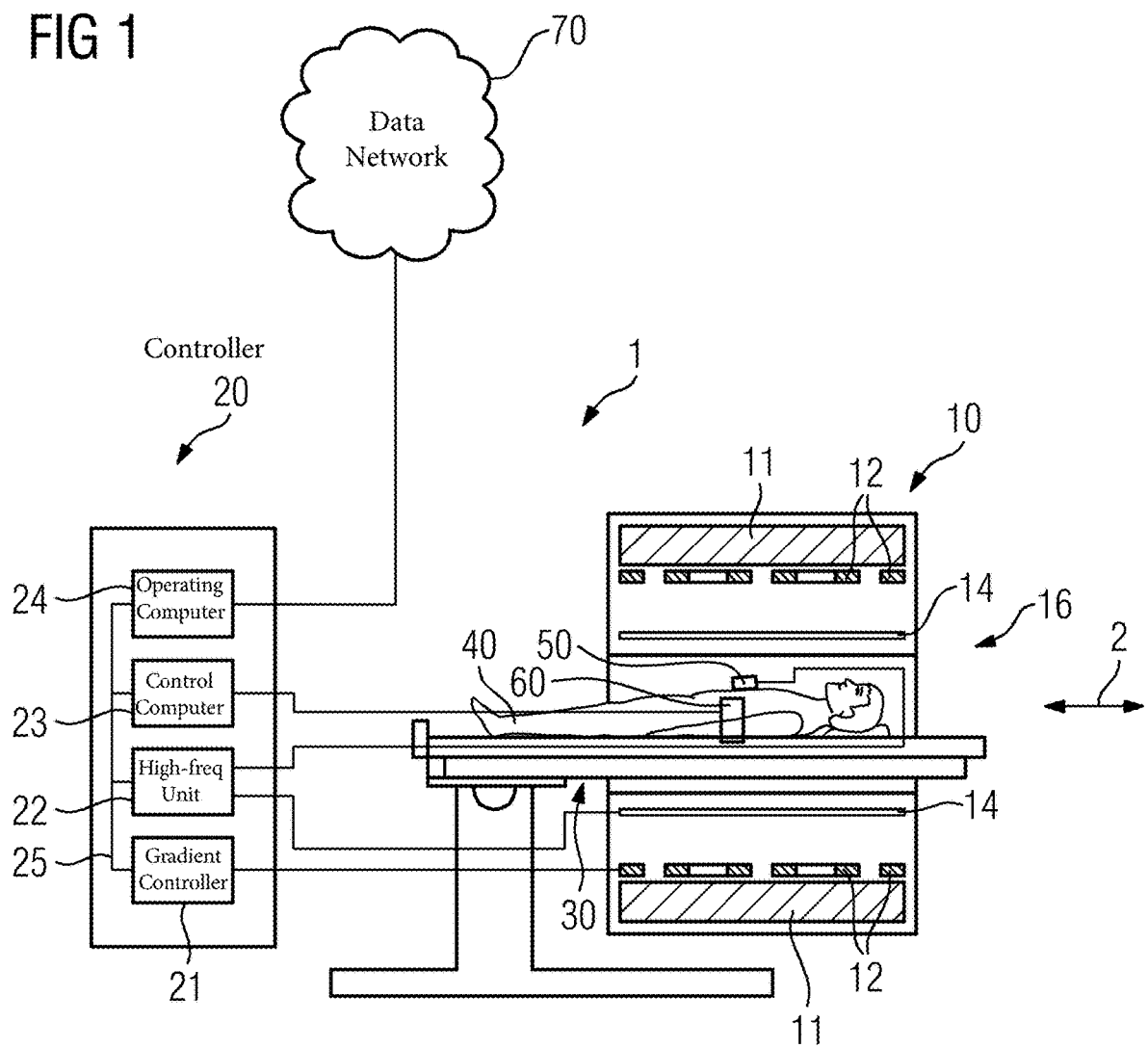

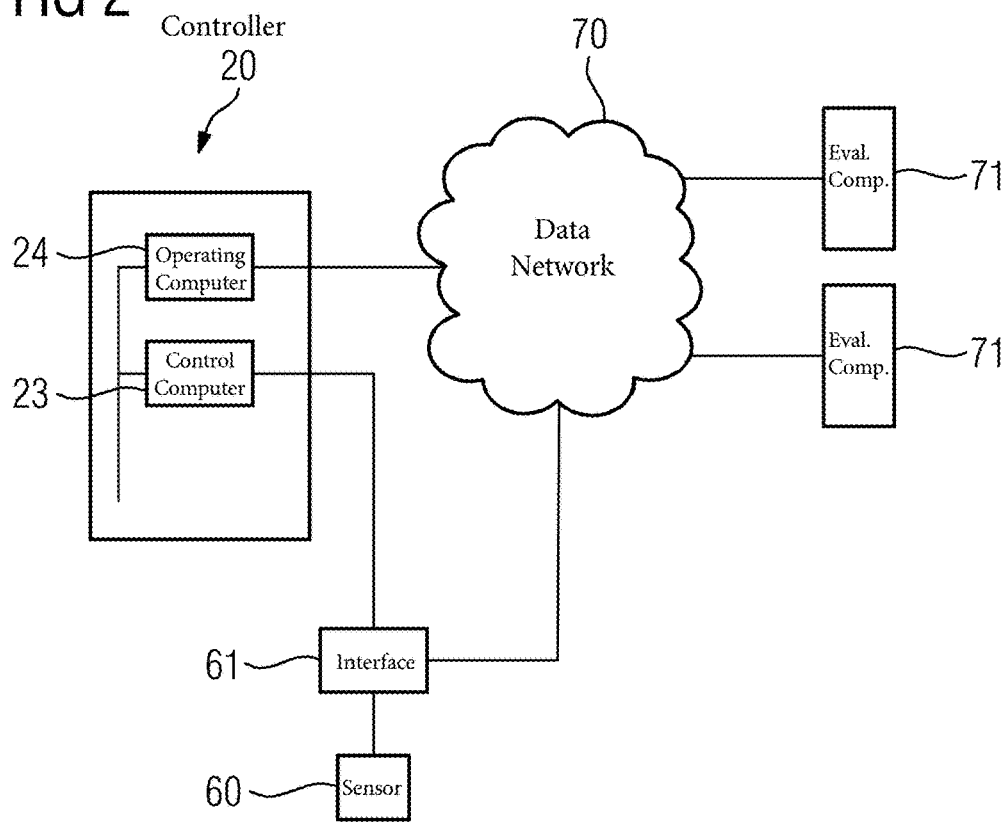
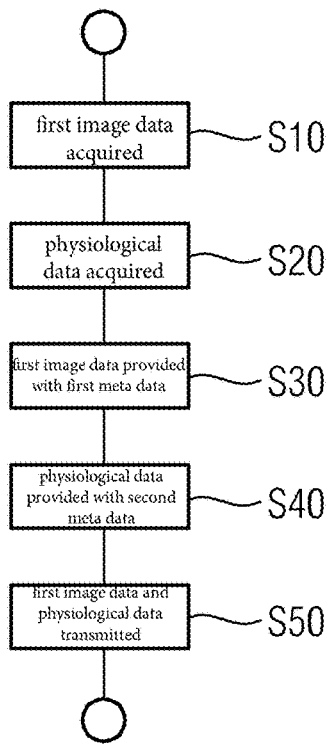

METHOD AND SYSTEM FOR DETERMINING MAGNETIC RESONANCE IMAGE DATA AS A FUNCTION OF PHYSIOLOGICAL SIGNALS

RELATED CASE

This application claims the benefit of DE 102016223478.1, filed on Nov. 25, 2016, which is hereby incorporated by reference in its entirety.

FIELD

The present embodiments relate to magnetic resonance (MR) imaging using physiological signals. The system has a magnetic resonance tomograph and an evaluation computer, wherein the magnetic resonance tomograph and the evaluation computer have a data link by data interfaces and over a data network.

BACKGROUND

Magnetic resonance tomographs are imaging devices that, for imaging an examination object, orient nuclear spins of the examination object using a strong external magnetic field and excite the spins to precession around this orientation by way of a magnetic alternating field. The precession or return of the spins from this excited state into a state with lower energy in turn generates a magnetic alternating field, also called a magnetic resonance signal, as a response, which is received by antennae.

With the aid of magnetic gradient fields, a spatial encoding is impressed on the signals, and this subsequently enables allocation of the received signal to a volume element. The received signal is then evaluated, and a three-dimensional representation of the examination object supplied.

The representation that is generated indicates a spatial density distribution of the spins.

Acquisition of the data for a large number of volume elements requires a considerable amount of time, which is often significantly longer than typical physiological processes such as beating of the heart or respiration. There are therefore magnetic resonance tomographs that acquire physiological measured values such as pulse or breathing by way of sensors to synchronize the image data acquisition by magnetic resonance with the physiological processes, so that, for example, data from a two-dimensional volume slice of the examination object is acquired during a pause in breathing, a further volume slice is acquired during the next pause in breathing and so on.

Document DE 10 2014 210 471 A1 describes a method for carrying out a magnetic resonance examination with a prospective movement correction.

From document DE 10 2015 205 937 A1 a method is known for simultaneously acquiring physiological signals and image data of a volume portion of an examination object.

For the safety of the patient, control of a magnetic resonance tomograph requires precise checking and certifying of the individual examination processes, so that only the most important fundamental examinations are covered by image data acquisition of this kind that is controlled by physiological signals.

SUMMARY AND DETAILED DESCRIPTION

It is therefore an object of the present embodiments to disclose a more flexible possibility for image acquisition in a magnetic resonance tomograph, which takes into account physiological signals.

The object is achieved by a method for determining image data as a function of physiological signals, a magnetic resonance tomograph, and a system for carrying out the method. The scope of the present invention is defined solely by the appended claims and is not affected to any degree by the statements within this summary. Using metadata and synchronization of the data from a physiological sensor and the magnetic resonance tomograph, it is possible to use separate independent computers or devices for generating the images from the magnetic resonance imaging data and use the sensor data for correction of the images in independent computers, e.g. workstations, for e.g. implementing and testing new image generation algorithms on the data. Modifications can be made without any danger for the patient while avoiding additional approval processes if the change where made to an integrated physiological sensor.

The method for determining MR image data as a function of physiological signals is carried out by a magnetic resonance tomograph and an evaluation computer. The magnetic resonance tomograph has a controller and a first data interface, and the evaluation computer has a second data interface. The first and the second data interfaces have a data link, for example, over a data network. The data network may be, for example, a wired network, such as an Ethernet network, or a wireless network, such as a WLAN. A wide area network is conceivable or even just a simple point-to-point connection.

The method has the step of acquiring first image data by way of the magnetic resonance tomograph. The first image data may be acquired, for example, by a spin-echo sequence or preferably by particularly fast sequences, such as EPI (Echo Planar Imaging) or FLASH (Fast Low-Angle Shot). First image data should in this connection be taken to be data from which a representation of an examined region is possible or can be obtained therefrom. The first image data can be, for example, data from the frequency space from which a spatial representation is firstly be reconstructed, or also already reconstructed spatial image data, but which may also be processed further before reproduction. Data from a hybrid space, which has frequency data as well as data for spatial representation, is also conceivable.

In one step of the method, physiological signal data is acquired. This may be all types of signal that are caused by changes or activities of the body, such as, for example, pulse, blood pressure, respiration, neural activity or movements. It is conceivable for the physiological signal data to be from a separate device, for example from an electrocardiograph or a mechanical sensor for detecting respiration. The signal data may be acquired directly by the separate device or may be forwarded to the magnetic resonance tomograph for evaluation.

In another step of the method, the first image data is provided with first meta data. The first meta data enables a temporal assignment of the first image data to the instant of acquisition.

In a further step of the method, the physiological signal data is provided with second meta data. The second meta data enables a temporal assignment of the physiological signal data to the instant of acquisition.

The meta data advantageously allows a temporal correlation to be made and the physiological signal data to be used during the subsequent image evaluation even with asynchronous transmission of first image data and physiological signal data in an evaluation computer.

In another step of the method, the first image data and the physiological signal data are transmitted to the evaluation computer, preferably over the data network. A plurality of evaluation computers may be present in the data network, and the first image data with the first meta data and the same or different physiological signal data with second meta data may be transmitted to the different evaluation computers to perform, for example, different evaluations in parallel.

The controller of the magnetic resonance tomograph may be distributed among different function units or processors that also run on different hardware devices. Control of image acquisition with radio signals may therefore run in an extra secure real-time-certified environment to rule out a risk to the patient, while images are reconstructed on a particularly powerful processor platform and the data interface is provided by a particularly secure network platform. Other combinations may be used.

Owing to regulatory requirements, changes and additions to the software of the magnetic resonance tomograph are subject to strict and time-consuming certification processes in order not to jeopardize the safety of a patient. Therefore, due to a relocation of the data, and thereby also subsequent evaluation steps, the method advantageously allows a flexible and fast adjustment and alteration of evaluation algorithms, as are required in clinical and university research, without exposing the patient to a risk. As the first image data and physiological signal data, which were acquired at the same instant, are combined, the physiological signal data may be used, for example, for correction during image evaluation, instead of simply just discarding finished image data if a movement was detected in the same period.

The magnetic resonance tomograph and the system share the advantages of the method.

In one embodiment of the method, the first image data and physiological signal data are acquired simultaneously.

Simultaneous acquisition of first image data and physiological signal data advantageously allows better correlation of the data and therefore, for example, better correction of the effect of physiological processes on the generated images.

In one embodiment of the method, the first meta data has information about a volume incorporated by the first image data. The information about an incorporated volume may be synchronization points that indicate when image data relating to a self-contained partial volume has been completely acquired or its acquisition was begun, for example, relating to a slice or a line, in other words a one-dimensional sequence of adjacent volume elements.

The synchronization points allow, for example, the evaluation computer to identify, without detailed and time-consuming analysis of the image data, when data begins for a self-contained partial volume. It is therefore conceivable for an evaluation of partial volumes to be easily distributed among different evaluation computers.

In one embodiment of the method, the physiological signal data is acquired by the magnetic resonance tomograph.

Acquisition of physiological data by the magnetic resonance tomograph is particularly advantageous if the data is acquired using the magnetic resonance tomograph itself, for example, a pulse or respiration identification by pilot tone transmitters, so that the radio signal may change as a result of altered absorption or altered geometry in rhythm with the respiration or heartbeat and may be detected directly by the receivers of the magnetic resonance tomograph. Acquisition by the magnetic resonance tomograph also allows this to synchronize with the magnetic resonance tomography in such a way that reciprocal disruption is optimally avoided. For example, an ECG with its weak electrical signals is disrupted by the strong high-frequency pulses and gradient fields so that data is preferably acquired between the pulses.

In one embodiment of the method, the controller of the magnetic resonance tomograph has a synchronization interface. An interface for the transmission of signals is regarded as a synchronization interface here, by way of which a synchronization of another device is possible with the magnetic resonance tomograph. This may be, for example, clock signals, or even a uni- or bi-directional interface, via which data of a synchronization protocol may be transmitted. Via a synchronization interface, the magnetic resonance tomograph has a signal link with a device for acquiring physiological signals. In one step of the method for synchronization, a synchronization signal is transmitted by the magnetic resonance tomograph to the device for acquiring physiological data.

The synchronization interface advantageously enables, for example, even devices made by other manufacturers for acquiring physiological signals, such as electrocardiographs, respiratory sensors or the like, to synchronize with the magnetic resonance tomograph and to generate second meta data in this way, which allows correct temporal assignment to image data with first meta data.

In one embodiment of the method, the first meta data and the second meta data are identical. For example, the meta data may have a time stamp which is identical if the first image data and the physiological signal data were acquired simultaneously.

Identical first meta data of the first image data and second meta data of the physiological signal data advantageously allow simple and fast assignment of time-related data.

In one embodiment of the method, the transmission step also includes processing the first image data and/or physiological signal data. For example, the data may be compressed or encrypted for transmission.

A compression of the first image data advantageously allows, for example, faster and more effective transmission, while encryption improves data protection and protects the data against manipulation.

In one embodiment, the method also has the steps of assigning physiological signal data to the first image data by way of the evaluation computer using the first meta data and second meta data and of evaluating the first image data by way of the evaluation computer as a function of the physiological signal data in second image data, which allows, for example, a graphic representation. "Evaluating" includes the two volumes of data being jointly processed in such a way that new shared data is generated as a function of the two volumes of data. The method goes beyond, for example, pure selection or discarding of image data, for example, if a movement was determined at the same time.

The evaluation of the first image data that is dependent on the signal data advantageously enables, for example, artifacts due to movements to be compensated, or even, conversely, dynamic effects due to physiological processes to be highlighted.

The magnetic resonance tomograph and the inventive system share the advantages of the method.

BRIEF DESCRIPTION OF THE DRAWINGS

Further advantages and details result from the following description of exemplary embodiments in connection with the drawings, in which in schematic diagrams:

FIG. 1 schematically shows an embodiment of a magnetic resonance tomograph;

FIG. 2 schematically shows an embodiment of a system;

FIG. 3 schematically shows one embodiment of a flowchart of a method.

DETAILED DESCRIPTION

FIG. 1 shows a schematic diagram of an embodiment of a magnetic resonance tomograph 1.

The magnetic resonance system 10 has a field magnet 11, which generates a static magnetic field $B_0$ for orientation of nuclear spins of samples or in a body of a patient 40 in a recording region. The recording region is arranged in a patient tunnel 16, which extends in a longitudinal direction 2 through the magnetic resonance system 10. The field magnet 11 is conventionally a superconductive magnet, which may provide magnetic fields having a magnetic flux density of up to 3 T, and even above this in the newest devices. For lower field strengths, permanent magnets or electromagnets having normal-conducting coils may also be used, however.

The magnetic resonance system 10 also has gradient coils 12, which provide for spatial differentiation of the acquired imaging regions in the examination volume ae are designed to overlay the magnetic field $B_0$ with variable magnetic fields in three spatial directions. The gradient coils 12 are conventionally coils including normal-conducting wires that may generate fields orthogonal to each other in the examination volume.

The magnetic resonance system 10 likewise has a body coil 14, which is designed to irradiate a high-frequency signal fed via a signal line into the examination volume and to receive resonance signals emitted by the patient 40 and emit them via a signal line. The magnetic resonance tomograph has, moreover, one or more local coil(s) 50, which are arranged in the patient tunnel 16 close to the patient 40.

A controller 20 supplies the magnetic resonance system 10 with the various signals for the gradient coils 12 and the body coil 14 and evaluates the received signals.

The controller 20 therefore has a gradient controller 21, which is designed to supply the gradient coils 12 with variable currents via feed lines. The currents provide the desired gradient fields in the examination volume in a temporally coordinated manner.

The controller 20 also has a high-frequency unit 22, which is designed to generate a high-frequency pulse with a predetermined time characteristic, amplitude and spectral power distribution to excite a magnetic resonance of the nuclear spins in the patient 40. Pulse powers in the region of kilowatts may be attained in the process. The high-frequency unit has for this purpose a high-frequency generator that may be implemented, for example, as a frequency synthesizer controlled by numerical values. The individual components are connected to each other by a signal bus 25.

The high-frequency signal generated by the high-frequency unit 22 is supplied by a signal link to the examination table 30 and distributed among one or more local coil(s) 50 and emitted into the body of the patient 40 to excite the nuclear spins there. However, emission of the high-frequency signal via the body coil 14 is also conceivable.

The local coil 50 then preferably receives a magnetic resonance signal from the body of the patient 40 because, owing to the small spacing, the signal-to-noise ratio (SNR) of the local coil 50 is better than in the case of receiving through the body coil 14. The MR signal received by the local coil 50 is processed in the local coil 50 and forwarded to the high-frequency unit 22 of the magnetic resonance tomograph 1 for evaluation and image acquisition. The signal link is likewise preferably used for this, although separate signal links or a wireless transmission are also conceivable. It is also conceivable for separate local coils or other antennae to be provided for receiving.

A separate control computer 23 in the controller 20 preferably undertakes the time-critical coordination of the gradient controller 21 and high-frequency unit 22. This may ensure that time-critical processes are not disrupted by operating processes and that there is no risk to the patient 40 due to electromagnetic fields.

An operating computer 24 of the controller 20 carries out processes that are not time-critical, such as the provision of a user interface, separately from the real-time tasks of the control computer 23. However, by way of suitable hardware and software measures, the control computer 23 and operating computer 24 may be provided on a shared hardware platform. The internal communication of the individual sub-units of the controller 20 may occur, for example, via a signal bus 25.

For external communication, for example to export the image data, the controller 20 has a first interface for data, preferably to a data network 70. The first interface, as shown in FIG. 1, may be provided, for example, in the operating computer. The first interface or the operating computer preferably has functionalities in the sense of a gateway that prevents access to the magnetic resonance tomograph, which access could disrupt the operation or safety thereof.

In FIG. 1, the magnetic resonance tomograph also has a physiological sensor 60 with which physiological signals of the patient 40, which cannot be detected by magnetic resonance tomography, or only with a significant delay, may be detected in real time. The sensor 60 may be, for example, a respiratory belt or another sensor for detecting the breathing activity, a pulse sensor, blood pressure gauge, ECG, EEG, oxygen saturation sensor, other chemical or electrical sensors that record a physiological measured value of the patient 40. Real-time provides that the measured value is detected during a pulse sequence of the MRT scan and in this way a temporal assignment between image acquisition and physiological measured value is possible.

In the embodiment shown in FIG. 1, the control computer 23 itself is configured to acquire the physiological signal data by the physiological sensor and provide the physiological signal data with second meta data, which has an item of time information and enables, in particular, a temporal assignment to simultaneously acquired first image data. The control computer 23, which also controls the gradient pulses and RF pulses, has the information about the temporal relation that is required for this.

FIG. 2 shows another embodiment. The physiological signal data is not provided with second meta data by the control computer 23 itself, but by the physiological sensor 60 or an interface unit 61 between magnetic resonance tomograph and physiological sensor 60.

Furthermore, FIG. 2 indicates a system including a magnetic resonance tomograph and an evaluation computer 71. For the sake of clarity, not all components of the magnetic resonance tomograph in FIG. 1 are now shown in FIG. 2. Furthermore, identical reference numerals designate the same items as in FIG. 1.

FIG. 2 shows a plurality of evaluation computers 71, which have a data link over the data network 70 with the magnetic resonance tomograph 1. Direct point-to-point connections would also be conceivable, however. The magnetic resonance tomograph 1 is configured to transmit image data with first meta data via the first data interface to the second data interface(s) of the evaluation computers 71.

In the embodiment in FIG. 2, the magnetic resonance tomograph 1 has a synchronization interface on the control computer 23, which is configured to output a synchronization signal to a device for acquiring physiological signals. In FIG. 2, the device for acquiring physiological signals has an interface 61 and the physiological sensor 60. The synchronization signal is not, or not just, a clock signal that defines a phase and/or frequency relationship between magnetic resonance tomograph 1 and interface 51. Instead, the interface may thereby define a time scale that allows a time interval to be determined between individual processes in the magnetic resonance tomograph 1 and the interface 61. For example, the interface 61 may generate second meta data which indicates a quantified time reference in relation to an event in the magnetic resonance tomograph 1.

The interface in FIG. 2 also has a signal link with the physiological sensor 60 and may acquire physiological signal data of a patient 40 in this way. For example, the interface 61 may be designed to receive a signal from a respiratory belt when the patient 40 begins to inhale. The interface 61 is then configured to provide this physiological signal data with second meta data, which indicates an instant of acquisition. Owing to the synchronization of the time scale of the interface 61 with a time scale of the magnetic resonance tomograph 1, a time reference may then be established, for example by an evaluation computer 71, between physiological signal data, for example inhalation, and image data with first meta data and may be taken into account during an evaluation of the image data. For this purpose, the magnetic resonance tomograph 1 and the interface 61 are configured to send the image data with first meta data or the physiological signal data with meta data to one or more evaluation computer(s) 71 over the data network 70.

It would, however, also be conceivable for the interface 61 to be part of the controller 20 of the magnetic resonance tomograph 1, for example, of the control computer 23, and this could simplify a synchronization. In this case, the magnetic resonance tomograph 1 also sends the physiological signal data with the second meta data to the evaluation computer(s) 71 via the first interface.

It would also be conceivable for the synchronization interface to not be configured separately, but to be implemented, for example, as a synchronization protocol via the first data interface and the data network 70.

FIG. 3 shows a schematic flowchart of one possible embodiment of the method.

First image data is acquired by the magnetic resonance tomograph 1 in a step S10. The first image data may be any data that may be acquired by the magnetic resonance tomograph 1 by magnetic resonance tomography as already described, by way of example, in relation to FIG. 1 and that is suitable for generating a spatial representation, in particular also data in the frequency and/or image space.

In another step S20 of the method, physiological signal data is acquired. This can occur as in FIG. 1, for example, by way of the magnetic resonance tomograph 1 with a physiological sensor 60 or also by way of a separate device for acquiring physiological signals as in FIG. 2.

In one possible embodiment, steps S10 and S20 occur simultaneously, in other words physiological signal data is acquired during execution of an MR sequence.

It is also conceivable for the first meta data and the second meta data to be identical.

In a further step S30, the first image data is provided with first meta data, with the first meta data enabling temporal assignment of the first image data to the instant of acquisition. This can occur, for example, by way of the control computer 23 of the controller 20 of the magnetic resonance tomograph since the control computer 23 coordinates the image acquisition. However, it would also be conceivable for the operating computer 24 to take image data from the control computer 23 and provide the control computer 23 with the second meta data. In particular, step S30 occurs, however, with such a slight delay, for example, of at most 1, 5, 50, 500 ms, that a time reference between image acquisition and time information is retained in the meta data. Information including date and time, including milliseconds, for example, would be conceivable as time information in the meta data but also a multi-place counter, for example in milliseconds since a defined zero point.

In one possible embodiment of the method the first meta data has information relating to a volume element incorporated by the image data, for example, a slice, line, or a voxel.

In another step S40 of the method, the physiological signal data is provided with second meta data, with the second meta data enabling a temporal assignment of the physiological signal data to the instant of acquisition. Step S40 may occur, for example in the embodiment in FIG. 1, as described in the case of step S30 by the magnetic resonance tomograph 1. In another embodiment as in FIG. 2, step S40 is carried out by the physiological sensor 60 or in connection with an interface 61. As already described in relation to S30, the second meta data is similarly configured to determine an instant of acquisition of the physiological signal data sufficiently accurately.

In a step S50, the first image data and the physiological signal data are transmitted over the data network 70 to the evaluation computer 71. Owing to the first and second meta data, it is not necessary for the image data to be transmitted simultaneously, immediately after acquisition or synchronously. Instead, the transmit may be delayed, depending on the speed and storage capacity of the interfaces and of the network. However, transmit preferably occurs with such a slight delay after acquisition that an evaluation still has a real-time reference to the cause of the physiological signals. For example, the transmit may occur within a period of a maximum of 10, 100 or 1000 ms after acquisition, so that a reaction to the acquired physiological signal is still possible.

With the step S50 of transmission, it is also conceivable for the image data and/or physiological signal data to be processed, for example compressed, to accelerate transmit, or to be encrypted to ensure data security.

In another step S60 of an embodiment of the method, the controller 20 of the magnetic resonance tomograph 1 transmits a synchronization signal via the synchronization interface to the device for acquiring physiological data, for example to the interface 61 or an intelligent physiological sensor 60. The synchronization signal may indicate, for example, a time or even have a complex protocol such as the Network Time Protocol.

In a step S70 of an embodiment of the method, the evaluation computer assigns physiological signal data to the first image data using the first meta data and second meta data and evaluates the first image data by way of the evaluation computer as a function of the assigned physiological signal data in second image data for imaging. It is, for example, conceivable, for one or more volume(s) of image data to be assigned to a physiological process indicated by the physiological signal data. For example, the image data may all have been acquired during a breath or a pause in breathing. It is then conceivable, for example, for a particular correction method to be used for compensation of the movement in an image with the second image data obtained from the first image data.

Although the invention has been illustrated and described in detail by the preferred exemplary embodiment, it is not limited by the disclosed examples and a person skilled in the art can derive other variations here from without departing from the scope of the invention. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

The invention claimed is:

1. A method for determining MR image data as a function of physiological signals by a magnetic resonance tomograph and an evaluation computer, wherein the magnetic resonance tomograph has a controller and a first data interface, wherein the evaluation computer has a second data interface, and the magnetic resonance tomograph and the evaluation computer have a data link formed by the first data interface and the second data interface, wherein the method has the following steps:
   acquiring first image data by the magnetic resonance tomograph;
   acquiring physiological signal data;
   assigning, to the first image data, first meta data, wherein the first meta data enables temporal assignment of the first image data to a first instant of acquisition;
   assigning, to the physiological signal data, second meta data, wherein the second meta data enables a temporal assignment of the physiological signal data to a second instant of acquisition; and
   transmitting the first image data and the physiological signal data to the evaluation computer,
   wherein the controller of the magnetic resonance tomograph has a synchronization interface via which the controller has a signal link with a device for acquiring the physiological signal data, further comprising transmitting a synchronization signal by the controller to a sensor for acquiring the physiological signal data.

2. The method as claimed in claim 1, wherein the first image data is frequency space data, image space data or data from a hybrid space.

3. The method as claimed in claim 1, wherein the first image data and the physiological signal data are acquired simultaneously.

4. The method as claimed in claim 1, wherein the first meta data has information about a volume incorporated by the first image data.

5. The method as claimed in claim 1, wherein the physiological signal data is acquired by the magnetic resonance tomograph.

6. The method as claimed in claim 1, wherein the evaluation computer assigns physiological signal data to the first image data using the first meta data and second meta data and evaluates the first image data as a function of the assigned physiological signal data in second image data for imaging.

7. The method as claimed in claim 1, wherein the first and the second meta data are identical.

8. The method as claimed in claim 1, further comprising, for the transmitting, processing the first image data, the physiological signal data, or combinations thereof.

9. A magnetic resonance system comprising:
   a controller, wherein the controller has a synchronization interface, and the controller is configured to transmit a synchronization signal with the synchronization interface;
   a first data interface; and
   a magnetic resonance tomograph configured to acquire first image data, to provide the first image data with first meta data, wherein the first meta data indicates a temporal assignment of the first image data to the instant of acquisition, and configured to transmit the first image data with the first meta data with the first data interface.

10. The magnetic resonance system as claimed in claim 9, further comprising a sensor for acquiring physiological data, wherein the controller has a signal link with the sensor for acquiring the physiological data by way of the synchronization interface, and the magnetic resonance tomograph and the sensor for acquiring the physiological data being configured to mutually synchronize, wherein the sensor for acquiring the physiological signals has a third data interface and is configured to provide the acquired physiological data with second meta data, wherein the second meta data indicates a temporal assignment of the physiological data to the instant of acquisition, and configured to transmit the physiological data with the second meta data with the third data interface.

11. The magnetic resonance system as claimed in claim 9, wherein the magnetic resonance tomograph also has a physiological sensor for acquiring physiological data and the magnetic resonance tomograph is configured to provide acquired physiological data with second meta data, wherein the second meta data indicates a temporal assignment of the physiological signal data to the instant of acquisition, and configured to transmit the physiological signal data with the second meta data with the first data interface.

12. A magnetic resonance tomograph comprising:
   a first interface;
   a controller configured to assign, to first image data, first meta data, wherein the first meta data indicates temporal assignment of the first image data to a first instant of acquisition, to assign, to physiological data, second meta data, wherein the second meta data enables a temporal assignment of the physiological signal data to a second instant of acquisition, and to transmit the first image data and the physiological signal data with the first interface; and
   a synchronization interface via which the controller has a signal link with a sensor for acquiring the physiological signal data, the controller configured to transmit a synchronization signal to the sensor for acquiring the physiological signal data.

13. The magnetic resonance tomograph of claim 12, wherein the first and the second meta data are identical.

14. The magnetic resonance tomograph of claim 12, wherein the controller is configured to, for the transmission, process the first image data, the physiological signal data, or combinations thereof.

15. A system comprising:
a magnetic resonance tomograph comprising a controller and a first data interface, the magnetic resonance tomograph configured to acquire first image data, to provide the first image data with first meta data, wherein the first meta data indicates a temporal assignment of the first image data to the instant of acquisition, and configured to transmit the first image data with the first meta data with the first data interface, wherein the controller has a synchronization interface, and the controller is configured to transmit a synchronization signal with the synchronization interface;
a sensor for acquiring physiological data, wherein the controller has a signal link with the sensor for acquiring the physiological data based on the synchronization signal from the synchronization interface, and the magnetic resonance tomograph and the sensor for acquiring the physiological data being configured to mutually synchronize, wherein the sensor for acquiring the physiological data has a third data interface and is configured to provide the acquired physiological data with second meta data, wherein the second meta data indicates a temporal assignment of the physiological data to the instant of acquisition, and wherein the sensor is configured to transmit the physiological data with the second meta data with the third data interface; and
an evaluation computer with a second data interface, wherein the magnetic resonance tomograph and the sensor for acquiring the physiological data have a data link with the evaluation computer, wherein the magnetic resonance tomograph and the sensor for acquiring the physiological data are configured to transmit the first image data with the first meta data and the physiological data with the second meta data to the evaluation computer.

16. A system comprising:
a magnetic resonance tomograph comprising a controller and a first data interface, the magnetic resonance tomograph configured to acquire first image data, to provide the first image data with first meta data, wherein the first meta data indicates a temporal assignment of the first image data to the instant of acquisition, and configured to transmit the first image data with the first meta data with the first data interface, wherein the magnetic resonance tomograph also comprises a physiological sensor for acquiring physiological data, and the magnetic resonance tomograph is configured to provide acquired physiological data with second meta data, wherein the second meta data indicates a temporal assignment of the physiological signal data to the instant of acquisition, and is configured to transmit the physiological signal data with the second meta data with the first data interface, wherein the controller has a synchronization interface, and the controller is configured to transmit a synchronization signal with the synchronization interface; and
an evaluation computer with a second data interface, wherein the magnetic resonance tomograph has a data link with the evaluation computer, wherein the magnetic resonance tomograph is configured to transmit the first image data with the first meta data and the physiological data with the second meta data to the evaluation computer.

* * * * *